US005585600A

United States Patent [19]
Froebel et al.

[11] Patent Number: 5,585,600
[45] Date of Patent: Dec. 17, 1996

[54] ENCAPSULATED SEMICONDUCTOR CHIP MODULE AND METHOD OF FORMING THE SAME

[75] Inventors: Francis E. Froebel, Essex Junction; David L. Gardell, Fairfax; Gary H. Irish, Jericho; Mohammed S. Shaikh, Essex Junction, all of Vt.

[73] Assignee: International Business Machines Corporation, Armonk, N.Y.

[21] Appl. No.: 116,167

[22] Filed: Sep. 2, 1993

[51] Int. Cl.[6] .................................................. H01L 23/02
[52] U.S. Cl. ........................ 174/52.4; 257/666; 257/667; 257/789
[58] Field of Search ................................ 174/52.1, 52.2, 174/52.3, 52.4; 257/660, 666, 676, 787, 788, 789, 790, 795, 1; 29/855, 856

[56] References Cited

U.S. PATENT DOCUMENTS

| | | | |
|---|---|---|---|
| 4,746,392 | 5/1988 | Hoppe | 156/244.12 |
| 4,788,583 | 11/1988 | Kawahara | 174/52.4 X |
| 4,862,245 | 8/1989 | Pashby et al. | 257/660 |
| 4,933,744 | 6/1990 | Segawa et al. | 174/52.2 X |
| 4,935,086 | 6/1990 | Bauer et al. | 156/246 |
| 4,962,415 | 10/1990 | Yamamoto et al. | 235/492 X |
| 4,965,654 | 10/1990 | Karner et al. | 257/676 |
| 4,974,057 | 11/1990 | Tazima | 174/52.2 X |
| 4,984,059 | 1/1991 | Kubota et al. | 357/68 |
| 5,006,402 | 4/1991 | Isayer | 428/294 |
| 5,045,918 | 9/1991 | Cagan et al. | 257/790 |
| 5,047,834 | 9/1991 | Kovac | 257/788 |
| 5,049,435 | 9/1991 | Uno et al. | 428/209 |
| 5,086,018 | 2/1992 | Conru et al. | 437/207 |
| 5,087,479 | 2/1992 | McManus et al. | 427/54.1 |
| 5,097,317 | 3/1992 | Fujimoto et al. | 357/72 |
| 5,151,559 | 9/1992 | Conru et al. | 174/52.4 |
| 5,173,766 | 12/1992 | Long et al. | 257/687 |
| 5,219,795 | 6/1993 | Kumai et al. | 437/211 |
| 5,227,663 | 7/1993 | Patil et al. | 257/718 |
| 5,386,342 | 1/1995 | Rostoker | 174/52.3 X |
| 5,399,805 | 3/1995 | Tyler et al. | 174/52.4 |

FOREIGN PATENT DOCUMENTS

0489349A1 11/1991 European Pat. Off. .

OTHER PUBLICATIONS

R. W. Nufer, *IBM Technical Disclosure Bulletin*, "High–Density Interconnectable Package", vol. 16, No. 9, Feb. 1974.

R. Dion and J. Benenati, *IBM Technical Disclosure Bulletin*, "Module Package", vol. 7, No. 7, Dec. 1964.

*Primary Examiner*—Laura Thomas
*Attorney, Agent, or Firm*—Calfee, Halter & Griswold

[57] ABSTRACT

The present invention provides a method for forming an improved lead-on chip semiconductor module and an improved module of this type. In a lead-on chip semiconductor device, a semiconductor chip which has a major surface having input and output bonding pads thereon, is secured to a lead frame having a plurality of leads adjacent the bonding pads by means of bonding wires connecting a respective one of the leads to a pad on the chip. A coating of dielectric material having a Young's modulus in the range of about 10 psi to about 500 psi is disposed around the entire length of each of the wires and over the pads and over the portion of the respective leads to which the wires are connected to act as a stress buffer. This material preferably has a $T_g$ of at least as low as −40° C. Also preferably this package is encapsulated with conventional encapsulant.

8 Claims, 4 Drawing Sheets

ENCAPSULATED SEMICONDUCTOR CHIP MODULE AND METHOD OF FORMING THE SAME

FIELD OF THE INVENTION

The present invention relates to an improved encapsulated semiconductor chip module of the "lead-on-chip" variety, and more particularly to such module which has improved resistance to wire bond failures and a method of forming such module.

BACKGROUND OF THE INVENTION

Lead-on-chip encapsulated modules such as those described in U.S. Pat. No. 4,862,245, issued Aug. 29, 1989 to Richard P. Pashby, et al. and assigned to the International Business Machines Corporation are well known in the art. These modules are comprised of a semiconductor chip having a plurality of bonding pads on one major surface, a dielectric layer joined to said surface and adjacent the bonding pads, and a plurality of lead frame conductors extending across the dielectric layer and ending immediately adjacent to the bonding pads. A gold wire is bonded to most of the bonding pads on the chip and extends from each respective pad to the bus bar or to each respective lead frame conductor. After bonding, the module is formed by the package encapsulation of the chips and leads in a hard plastic material.

An improved lead-on-chip device is shown in U.S. Pat. No. 5,151,559, dated Sep. 29, 1992 and issued to H. Ward Conru, et al. and assigned to the International Business Machines Corporation. In this improved device, a second dielectric, comprised of a thermal setting plastic, is forced down over the wires after the wires are bonded to the chip pads and the lead frame conductors and before encapsulation of the package. Forces are applied to the second dielectric layer to cause the wires underneath to be crushed down and held against the respective pads and leads to which they are connected. This improves the contact between the wire and the leads and minimizes defects or failures in wire bonding junctions. This improved device is particularly advantageous when used in a stacked semiconductor arrangement.

A problem of wire bond reliability occurs when lead-on-chip semiconductors are repeatedly exposed to a wide range of temperature variations. Such temperature cycling leads to expansion of the encapsulated materials. The resulting internal stress causes breaking of the wires or ruptures in the junctions between the wires and the lead frame or terminal pads.

SUMMARY OF THE INVENTION

The present invention is an improved lead-on-chip semiconductor, as taught in U.S. Pat. No. 4,862,245. It differs from the devices disclosed in this patent by placing a thin coat of material having a Young's modulus in the range of 10 psi to about 500 psi around not only the entire length of each bonding wire, but also around the contact points where each bonding wire meets with a pad, a lead frame conductor, or the bus bar. Applying the stress buffer reduces breaking of the wires and minimizes ruptures in the junctions between the wires and the lead frames, terminal pads and the bus bar caused by subsequent changes in expansion due to temperature variations that occur after encapsulation of the chip, bus bar, lead frame and bonding wires.

The present invention also provides a method for forming an improved lead-on-chip semiconductor module. The method involves applying a stress buffer, comprising a dielectric material having a Young's modulus of about 10 psi to about 500 psi to the wire bonds, bonding pads, that portion of the bus bar to which the bonding wires are connected, and that portion of the lead frame conductors to which the bonding wires are connected. The stress buffer is applied after the bus bar or lead frame conductors are connected to the bonding pads and before the module is encapsulated in a hard plastic material.

DESCRIPTION OF THE PREFERRED EMBODIMENT

Figure 1:
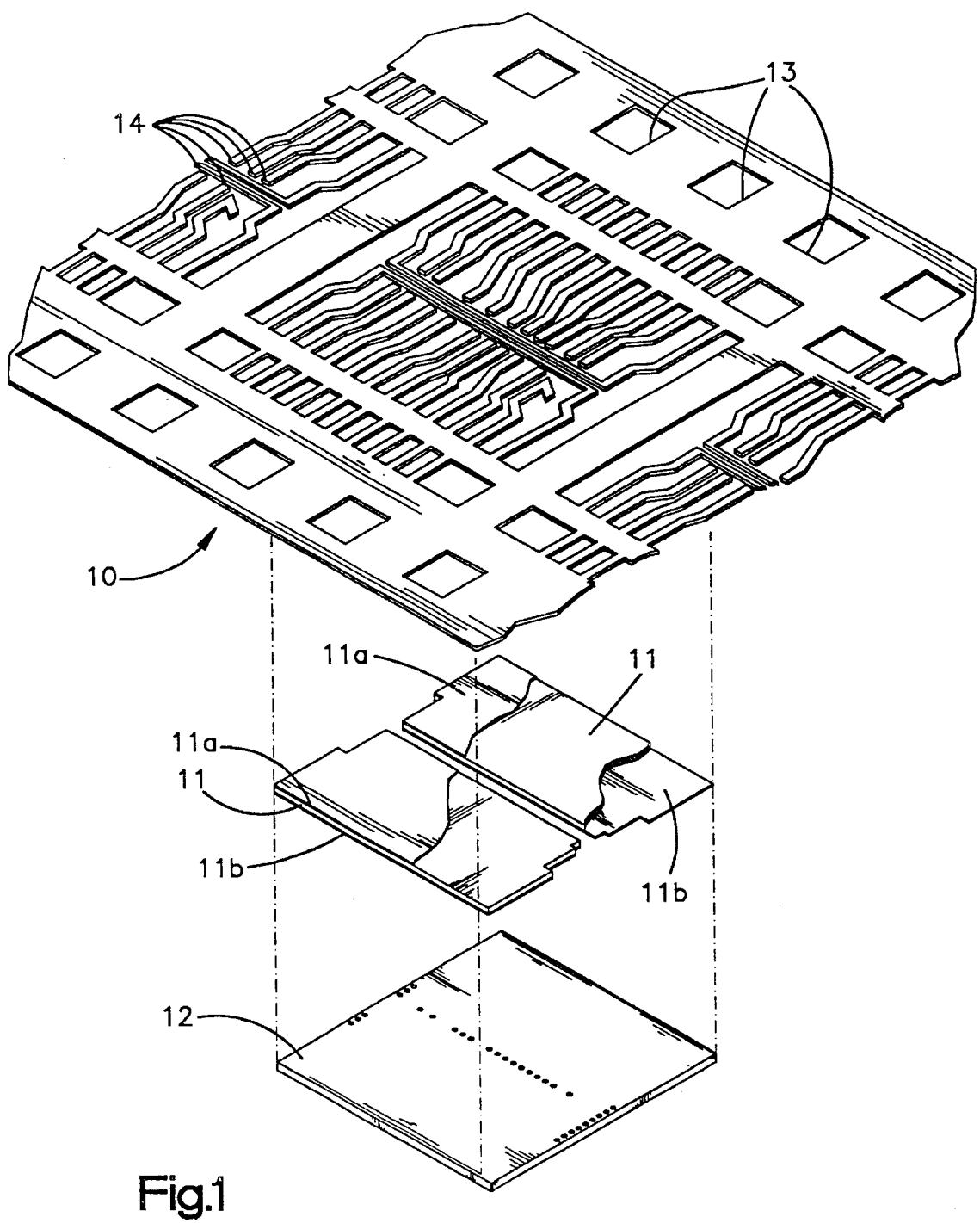
FIG. 1 is an exploded perspective view of a portion of a lead-on-chip semiconductor package showing the spatial relationship of the lead frame, tape and semiconductor chip before the selvage is removed.

FIG. 1 is an exploded view, somewhat schematic, of a portion of the present invention showing the spatial relationship of a lead frame 10, a tape 11, and a semiconductor chip 12. The lead frame 10 is produced from metal sheet stock and formed with a plurality of indexing holes 13 and contains lead frame conductors 14. Such lead frames 10 are preferably made from a copper alloy and are well known in the semiconductor packaging art.

The tape 11 is a polymer film that will not crack or disintegrate at normal processing temperature ranges. This tape 11 can be formed, for example, of a polyimide film sold by the DuPont deNemours Company under the tradename "Kapton". Such polyimide films preferably are between 1.0 and 2.0 mils (0.001 and 0.002 inches) in thickness and can be thermally enhanced by aluminum or silicon nitride additions therein. To assure that short circuits between the lead frame and the chip do not occur, it is preferred that the tape 11 be a dielectric.

The tape 11 preferably has adhesive coatings 11a and 11b which are applied as thin films to the major surfaces of the tape 11 and are used to help secure the tape 11 to the lead frame 10 and the chip 12. If desired, the adhesive layers 11a and 11b applied to the different major surfaces of the tape 11 can be of different materials and can be selected from a group of epoxies, acrylics, silicones and polyimides. One material suitable for use as an adhesive coating is sold by the Rogers Corporation of Chandler, Ariz., under the tradename "Rogers 8970".

In lieu of the adhesive coated film, the electrically insulating tape 11 can consist solely of one of the above listed adhesives so long as the adhesive is either sufficiently dense or thick enough to electrically insulate the lead frame conductors 14 from the chip surface. In such a case, the adhesive layer can be applied to the lead frame conductors 14 or to the top surface of the chip 12.

Figure 2:
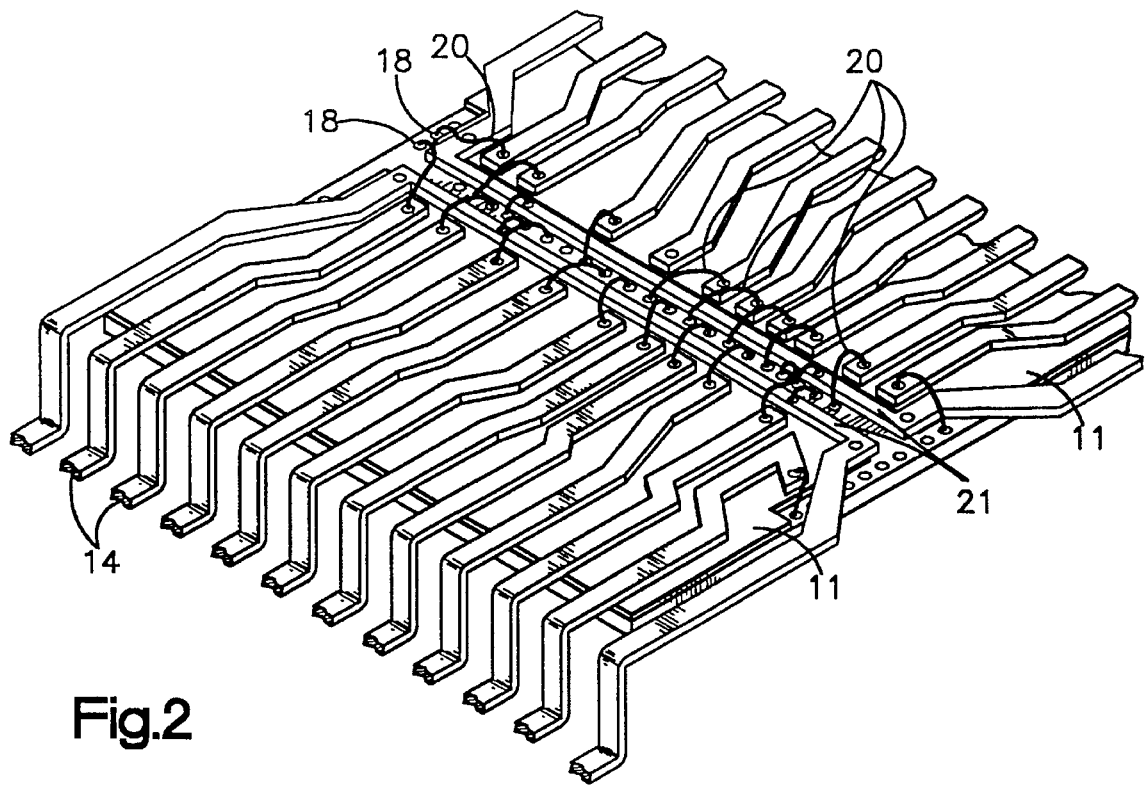
FIG. 2 is a perspective view of a portion of a semiconductor package showing the lead frame conductors and the bus bar connected by bonding wires to the chip bonding pads before the stress buffer and encapsulant are applied to the package.

FIG. 2 shows the lead frame conductors 14 bonded onto the semiconductor chip 12 and secured in place via the adhesive coated tape 11. It should be noted that in this view the selvage including the indexing holes 13 has been cut away from the lead frame conductors 14. The conductors have been formed using techniques well known to the art. The ends of the interior portions of the lead frame conductors 14 are intimately connected to bonding pads or terminals 18 on the semiconductor chip 12 via gold wires 20.

It is preferred that a bus bar 21 which traverses the length of the chip 12 in close proximity to the central line be included in the package. The bus bar 21 serves both as a means for dissipating heat and as a terminal strip. Gold wires 20 can also be used to bond a chip pad 18 to the bus bar 21. The wires 20 are bonded to the lead frame conductors 14, the bus bar 21, and the chip pads 18 by thermal compression or thermal sonic techniques. These techniques are well known in the semiconductor packaging art.

The vertical loop height of the bonding wires 20, defined as the maximum vertical distance between the surface of the chip 12 and the top surface of the gold wire 20, typically ranges from about 0.010 inches to 0.030 inches. The preferred vertical loop height of the bonding wires 20 of the present invention, is 0.015 inches or less.

Figure 3:
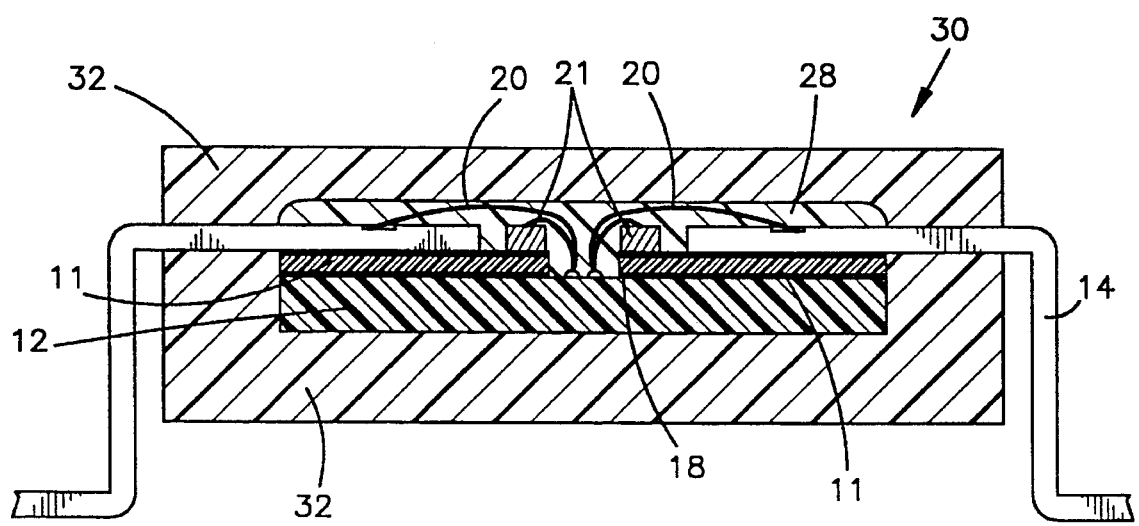
FIG. 3 is a longitudinal sectional view of the semiconductor package after disposition of the stress buffer over the chip bonding pads, bonding wires and leadframe conductors, and encapsulation of the package in plastic.

FIG. 3 shows a longitudinal sectional view, somewhat schematic, of the chip package, designated generally as 30, which has been formed in the following manner. After the wires 20 are bonded to selected pads 18 the bus bar 21 and lead frame conductors 14 in a conventional manner, a stress buffer 28, comprising a dielectric coating having a Young's modulus in the range of about 10 to about 500 psi, is applied over the pads 18, the wires 20, that portion of the lead frame conductors 14 to which the wires 20 are connected, and that portion of the bus bar 21 to which the wires 20 are connected. To minimize ingress of corrosive environmental contaminates, which can occur if the package is not fully-encapsulated, the stress buffer 28 should not cover the entire surface area of the chip 12. Preferably, the stress buffer 28 is of sufficient viscosity to assure that wires 20, the pads 18 and the portions of the lead frame conductors 14 which are connected to the wires 20 remain coated and do not become uncovered during subsequent processes and procedures. Elastomers, for example, may have sufficient viscosity to maintain the shape of the stress buffer 28 during subsequent processing. To assure that the stress buffer does not become rigid and thereby shear the wires during thermal cycling tests required by certain users of the chip packages, the stress buffer 28 should have a glass transition temperature (Tg) of at least −40° C. although a stress buffer having a Tg of −50° C. is even less likely to become rigid under the conditions of the test. A stress buffer having a Tg of −65° C. is preferred since the packages are subjected to this temperature during testing, and a Tg of −100° C. is even more desirable. The stress buffer 28 should also have a coefficient of thermal expansion (CTE) in the range of 0 ppm/° F. to 1000 ppm/° F. to reduce stress on the wires 20 and to minimize breakage of the wires during temperature variations. Compounds known to have these properties include epoxies, vinyl materials and silicone gels. One such compound suitable for use in the present invention is a silicone gel sold under the tradename "Amicon," from Emerson-Cummings, Canton, Mass. Another is the EC450 GE silicone gel available from G.E. Company, Silicon Products Division, Waterford, N.Y.

To provide coating thickness control, process consistency and reduced dispensing time, it is preferred that the stress buffer 28 be applied with an automated dispensing tool although such application can be done manually. One such tool suitable for use in the present invention is the Evox, Model Number SF 08700, made by Evox-Automec, Finland. The preferred vertical height of the stress buffer 28 above the gold wire 20 is about 0.002 inches.

Typically, both the stress buffer 28 and the tape 11 are cured at 150° C. for 2 hours after application of the stress buffer 28.

Figure 4:
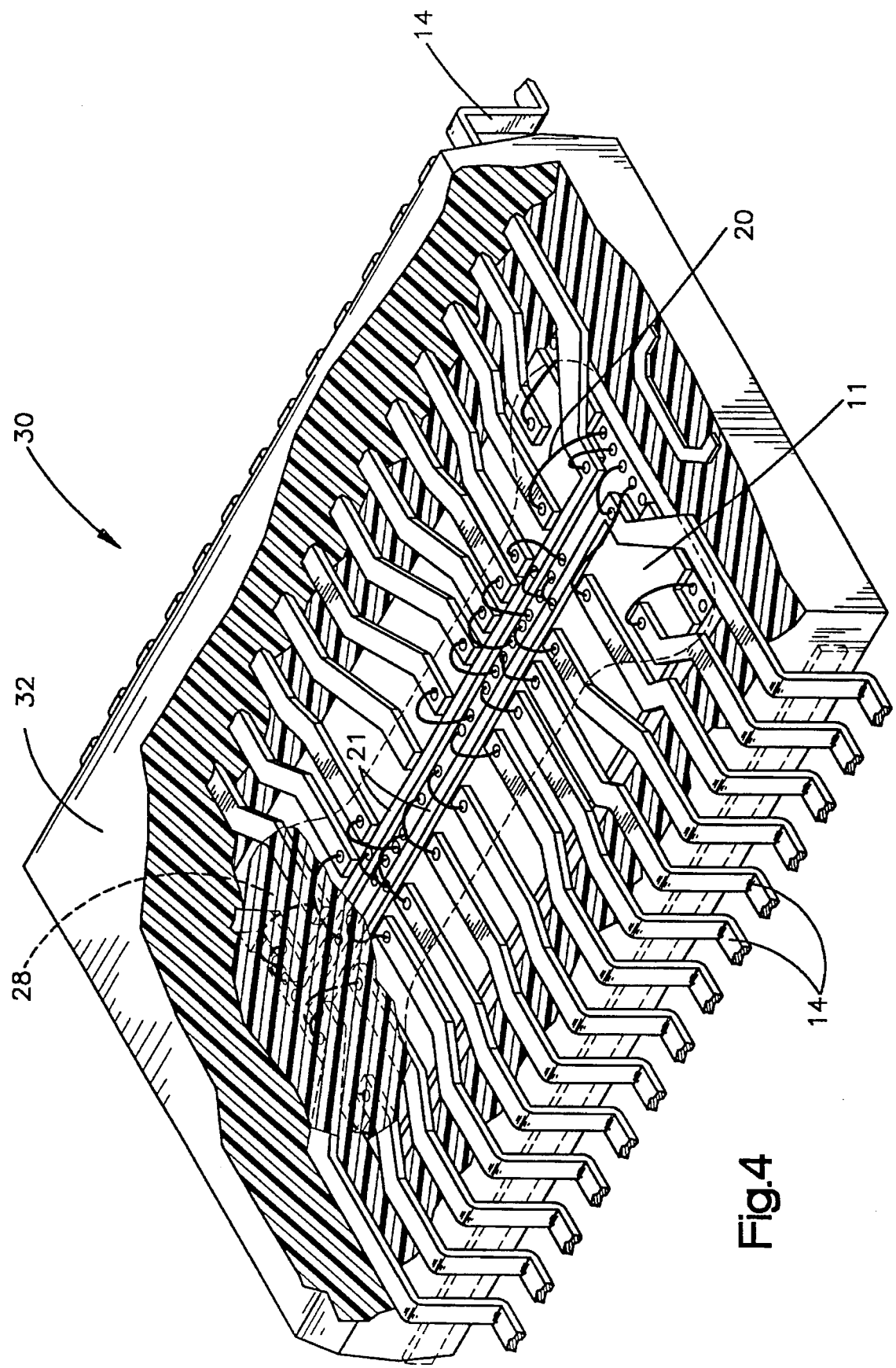
FIG. 4 is a perspective view of one embodiment of the present invention showing an encapsulated semiconductor chip with part of the encapsulation material and stress buffer broken away to expose the conductors, the semiconductor chip, the chip bonding pads, the bus bar, and the bonding wires.

FIG. 4 is a somewhat schematic depiction of the semiconductor package 30 containing a semiconductor chip 12 in which part of the encapsulating material 32 and stress buffer 28 has been removed for clarity of illustration. The semiconductor chip 12, wires 20, tape 11, and stress buffer 28 are encapsulated by injection molding of the encapsulating material 32, typically a thermoset plastic, such as Hysol HYS-25F, available from Dexter-Hysol, Olean, N.Y.

Semiconductor packages formed according to the present invention were stress tested to determine their wire bond reliability. Following encapsulation, the packages were preconditioned by baking for 24 hours at 125° C. and then soaking for 10 days at 85° C. and 25% relative humidity. To mimic the conditions of soldering which would be encountered in subsequent operations, the packages were then subjected to three vapor phase reflow cycles at 200° C. All the leads in the packages were electrically tested for opens, or wire bond failures, following these preconditioning procedures and after each thermal cycle stress. Resistance increases of 0.5 ohms or greater were considered as open, that is, indicative of wire bond failure.

A summary of the results for packages subjected to thermal cycle stressing from 0° to 125° C. are shown in Table 1. Those packages which included no stress buffer began to exhibit wire bond failure between 1500 and 2500 thermal cycles. After 4500 cycles, wire bond failures were observed in more than half of the packages. In contrast, packages containing a stress buffer according to this invention, particularly the silicone gel Amicon which has a Young's modulus of 25 psi, exhibited significantly fewer failures. When the Amicon stress buffer was cured at 165° for 3 hours, no wire bond failures were observed after 5500 thermal cycles.

TABLE 1

| 0 to 125° C. THERMAL CYCLE (T/C) STRESS DATA | | | |
|---|---|---|---|
| Description | No Stress Buffer | Stress Buffer (Amicon) | Stress Buffer (Amicon) |
| Cure | N/A | 5 minutes at 150° C. | 3 Hours at 165° C. |

TABLE 1-continued 0 to 125° C. THERMAL CYCLE (T/C) STRESS DATA

| Description | No Stress Buffer | Stress Buffer (Amicon) | Stress Buffer (Amicon) |
|---|---|---|---|
| Sample Size | 49 | 42 | 47 |
| Cumulative Fails: | | | |
| 513 T/C Readout | 0 | 0 | 0 |
| 1588 T/C Readout | 1 | 1 | 0 |
| 2588 T/C Readout | 9 | 1 | 0 |
| 3588 T/C Readout | 18 | 1 | 0 |
| 4588 T/C Readout | 28 | 1 | 0 |
| 5588 T/C Readout | (*) | 1 | 0 |

T/C Thermal cycles.
(*) Stress was terminated at 4500 thermal cycles.
N/A Not Applicable A summary of the results for packages subjected to thermal cycling at various temperature ranges, including −65° C. to +150° C., is shown in Table 2. The preconditioning of these packages included: subjecting the packages to 10 thermal cycles of −40° to +65° C.; baking the packages for 24 hours at 125° C.; soaking the packages at 30° C. for 96 hours in a 60% relative humidity atmosphere; and then exposing the packages to three vapor phase reflow cycles at 200° C. In this investigation, the effects of two stress buffers, particularly Amicon and the GE silicone gel EC450, on wire bond reliability were tested. The impact of wire loop height, that is, the maximum vertical distance between the chip surface and the gold wire top surface, was also investigated. The results indicate that reducing the loop height from 0.028 inches to 0.015 inches significantly improves wire bond reliability during temperature cycling. When the loop height was 0.028 inches, wire bond failure was observed in all of the packages containing Amicon stress buffer following 500 cycles of −65° C. to +150° C. The number of Amicon-containing packages exhibiting wire bond failures after similar thermal cycling conditions was reduced significantly when the loop height was 0.015 inches. As summarized in Table 2, a similar beneficial effect of lower loop height on wire bond reliability was observed when the stress buffer was the GE silicone gel.

TABLE 2

EFFECT OF LOOP HEIGHT, TEMPERATURE RANGE, AND STRESS BUFFER ON WIRE BOND FAILURES

| CONDITIONS | SS | FMT FAIL | T0 FAIL | CUMULATIVE FAILS | #MOD CYCLE | CUMULATIVE FAILS | #MOD CYCLE | CUMULATIVE FAILS | #MOD CYCLE | CUMULATIVE FAILS | #MOD CYCLE |
|---|---|---|---|---|---|---|---|---|---|---|---|
| AMICON: | | | | | | | | | | | |
| LOW LOOP −65 to +150° C. | 39 | 0 | 0 | 1 | 146 | 1 | 295 | 1 | 500 | 1 | 986 |
| LOW LOOP −40 to +150° C. | 36 | 0 | 0 | 0 | 152 | 0 | 302 | 0 | 502 | 0 | 1000 |
| LOW LOOP −20 to +150° C. | 36 | 0 | 0 | 0 | 151 | 0 | 301 | 0 | 501 | 0 | 1000 |
| NORM LOOP −65 to +150° C. | 39 | — | — | 5 | 146 | 32 | 295 | 39 | 500 | | |
| NORM LOOP −40 to +150° C. | 39 | 0 | 0 | 0 | 152 | 0 | 302 | 0 | 502 | 1 | 1000 |
| NORM LOOP −20 to +150° C. | 31 | 0 | 0 | 0 | 151 | 0 | 301 | 2 | 501 | 9 | 1000 |
| GE SILICONE: | | | | | | | | | | | |
| LOW LOOP −65 to +150° C. | 57 | 0 | 0 | 0 | 200 | 0 | 403 | — | — | — | — |
| NORM LOOP −65 to +150° C. | 57 | 0 | 0 | 0 | 200 | 0 | 403 | — | — | — | — |

Figure 5:
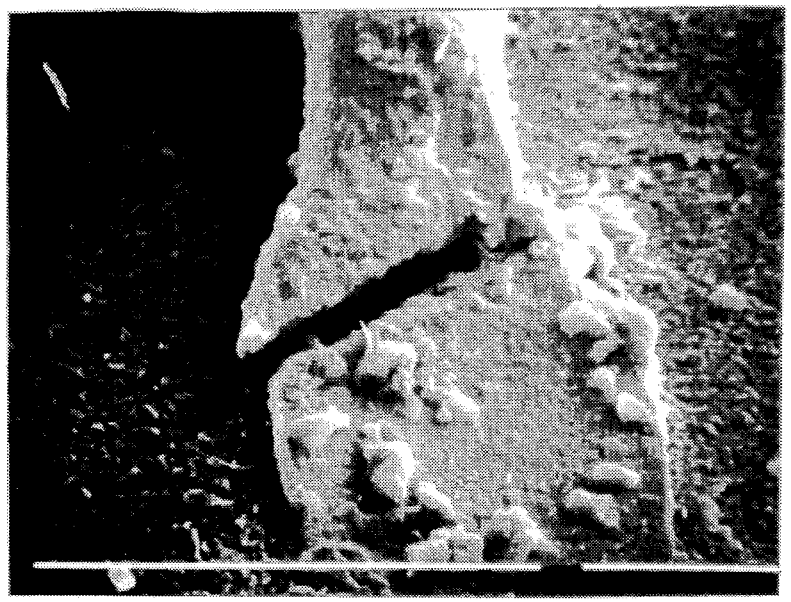
FIG. 5 is a scanning electron photomicrograph of a typical wire bond failure in a semiconductor package having no stress buffer that occurred after 2500 thermal cycles at 0° C. to 125° C.

SS Sample size
FMT Final module test done prior to preconditioning
T0 Electrical test done after preconditioning and before thermal cycle stressing
MOD Number of modules in the sample that exhibit wire bond failures
Low Loop 0.015 inch vertical height
Norm Loop 0.028 inch vertical height
— Not tested FIG. 5 is a scanning electron photomicrograph, at 750X magnification, of a typical wire bond failure 40 in an encapsulated semiconductor package having no stress buffer that occurred after 2500 thermal cycles at 0° to 125° C. The failure 40 is located at the juncture of the wire 20 and the lead frame conductor 14.

Figure 6:
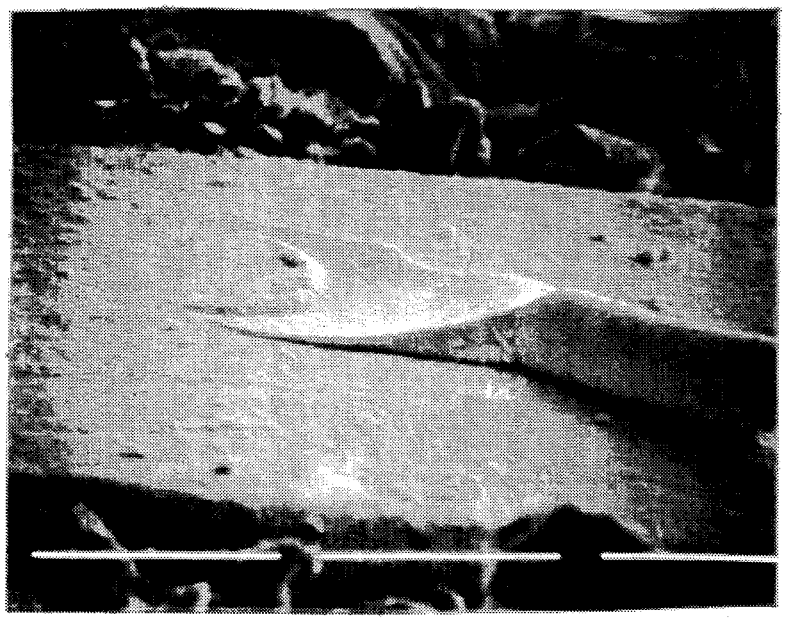
FIG. 6 is a scanning electron photomicrograph of a wire bonded to the surface of a lead frame conductor in a semiconductor package including a stress buffer after 2500 thermal cycles at 0° C. to 125° C.

FIG. 6 is a scanning electron photomicrograph of a wire 20 bonded to the surface of a lead frame conductor 14 in a semiconductor package comprising the stress buffer Amicon after 2500 thermal cycles at 0° to 125° C. The bond is intact.

These results indicate that the present invention provides an improved semiconductor package with greater wire bond reliability after thermal cycle stressing.

What is claimed is:

1. A method of forming a semiconductor package comprising the steps of:

providing a semiconductor chip having first and second major surfaces with input and output bonding pads on the first major surface;

providing a lead frame having a plurality of leads adjacent said chip;

electrically connecting respective ones of the leads to respective ones of the bonding pads on the chip by conductive bonding wires therebetween;

coating the entire length of each of said wires, said pads, and that portion of the respective leads to which said wires are connected with a dielectric material having a Young's modulus in the range of about 10 psi to about 500 psi.

2. A method of forming a semiconductor package comprising the steps of:

securing an electrically insulating layer on a major surface of a semiconductor chip having input and output bonding pads on the major surface;

securing a lead frame having a plurality of leads on the insulating layer;

electrically connecting respective ones of the leads to respective ones of the bonding pads on the chip by conductive bonding wires therebetween applying a stress buffer, comprising a dielectric material having a Young's modulus in the range of about 10 psi to 500 psi, a glass transition temperature of at least as low as −40° C., and a coefficient of thermal expansion in the range of 0 ppm/° F. to 1000 ppm/° F. around the entire length of each of said wires, over said pads, and over that portion of the respective leads to which said wires are connected.

3. The method of claim 1 wherein the dielectric material comprises a silicone.

4. The method of claim 1 wherein the dielectric material comprises a silicone having a Young's modulus of about 25 psi.

5. The method of claim 1 wherein the vertical loop height of the bonding wires is at least as short as 0.015 inches.

6. The method of claim 2 wherein the dielectric material comprises a silicone.

7. The method of claim 2 wherein the dielectric material comprises a silicone having a Young's modulus of about 25 psi.

8. The method of claim 2 wherein the vertical loop height of the bonding wires is at least as short as 0.015 inches.

* * * * *